United States Patent
Ahonen et al.

(10) Patent No.: US 11,456,741 B2
(45) Date of Patent: Sep. 27, 2022

(54) QUBIT LEAKAGE ERROR REDUCTION

(71) Applicant: IQM Finland Oy, Espoo (FI)

(72) Inventors: Olli Ahonen, Espoo (FI); Johannes Heinsoo, Espoo (FI); Mikko Möttönen, Espoo (FI); Jami Rönkkö, Espoo (FI); Jaakko Salo, Espoo (FI); Jani Tuorila, Espoo (FI)

(73) Assignee: IQM Finland Oy, Espoo (FI)

( * ) Notice: Subject to any disclaimer, the term of this patent is extended or adjusted under 35 U.S.C. 154(b) by 24 days.

(21) Appl. No.: 17/107,262

(22) Filed: Nov. 30, 2020

(65) Prior Publication Data
US 2022/0014192 A1 Jan. 13, 2022

(30) Foreign Application Priority Data
Jul. 7, 2020 (EP) .................................. 20184473

(51) Int. Cl.
*H03K 19/003* (2006.01)
*G06N 10/00* (2022.01)
(Continued)

(52) U.S. Cl.
CPC ....... *H03K 19/00346* (2013.01); *G06N 10/00* (2019.01); *H01L 39/223* (2013.01); *H03H 11/04* (2013.01)

(58) Field of Classification Search
CPC .............. H03K 19/00346; G06N 10/00; H01L 39/223; H03H 11/04
(Continued)

(56) References Cited

U.S. PATENT DOCUMENTS 10,352,992 B1 * 7/2019 Zeng .................. G01R 31/2851
10,354,198 B1 7/2019 Filipp et al.
2019/0237648 A1 * 8/2019 Przybysz .............. H01L 39/045

FOREIGN PATENT DOCUMENTS

EP 3398213 A1 11/2018
WO 2017115008 A1 7/2017
(Continued)

OTHER PUBLICATIONS

Muhonen et al., "Micrometer-scale refrigerators." Reports on Progress in Physics 2012, vol. 75, No. 4, dated Mar. 22, 2012, 42 pages.
(Continued)

*Primary Examiner* — Tomi Skibinski
(74) *Attorney, Agent, or Firm* — K&L Gates LLP

(57) ABSTRACT

It is an objective to provide an arrangement for reducing qubit leakage errors in a quantum computing system. According to an embodiment, an arrangement for reducing qubit leakage errors includes a first qubit and a second qubit selectively couplable to each other. The arrangement also includes an energy dissipation structure that is selectively couplable to the first qubit. The energy dissipation structure is configured to dissipate energy transferred from the first qubit. The arrangement further includes a control unit configured to perform a first quantum operation to transfer a property of a quantum state from the first qubit to the second qubit, couple the first qubit to the energy dissipation structure for a time interval, and perform a second quantum operation to transfer the property of the quantum state from the second qubit to the first qubit after the time interval.

20 Claims, 4 Drawing Sheets

(51) Int. Cl.
*H01L 39/22* (2006.01)
*H03H 11/04* (2006.01)

(58) Field of Classification Search
USPC .......................................................... 327/528
See application file for complete search history.

(56) References Cited

FOREIGN PATENT DOCUMENTS

| WO | 2017115160 A1 | 7/2017 |
| WO | 2020106312 A1 | 5/2020 |

OTHER PUBLICATIONS

International Search Report and Written Opinion issued to PCT/FI2021/050520 dated Dec. 16, 2021, 5 pages.
Extended European Search Report issued to EP20184473.5, dated Feb. 26, 2021, 11 pages.
Sevriuk et al., "Fast control of dissipation in a superconducting resonator," Applied Physics Letters, Article published online Aug. 20, 2019, http://creativecommons.org/licenses/by/4.0, 4 pages.

* cited by examiner

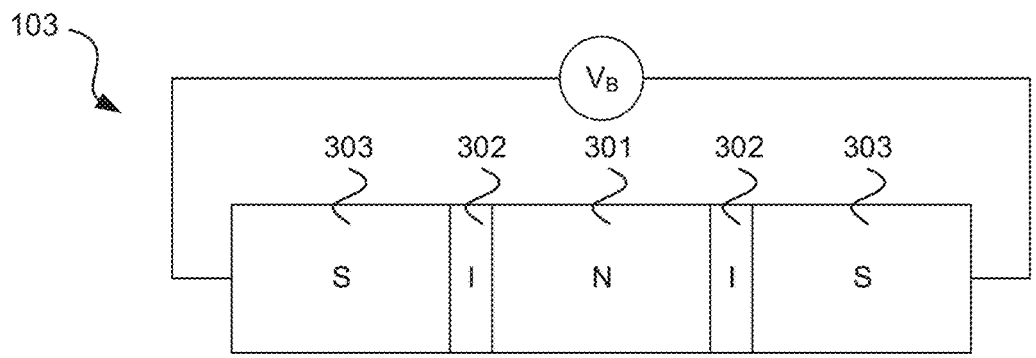

FIG. 3

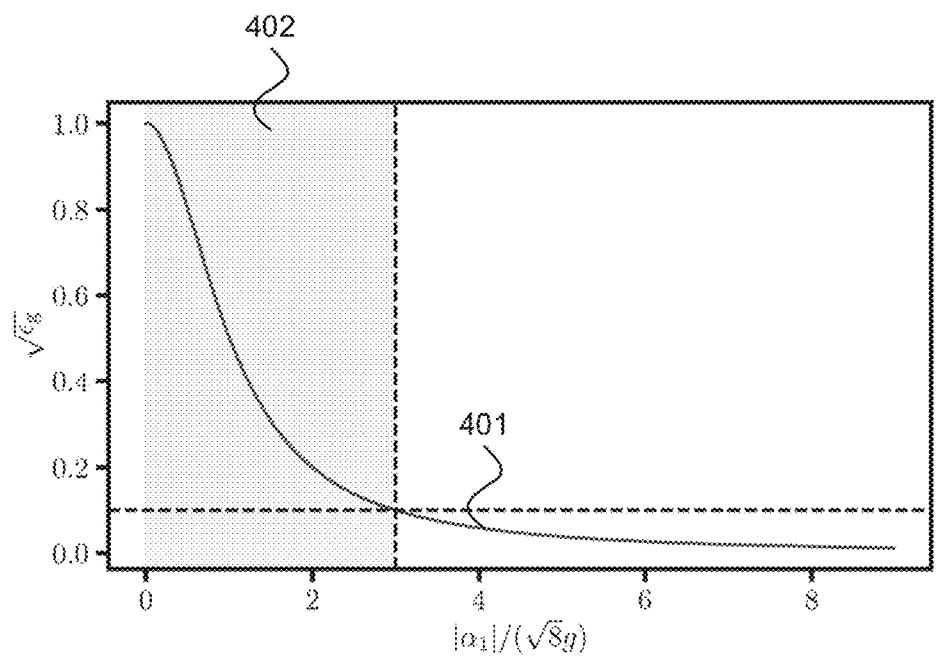

FIG. 4

| parameter | symbol | value |
|---|---|---|
| qubit anharmonicity | $\alpha_1$ | -0.25 GHz h |
| ancilla anharmonicity | $\alpha_2$ | -0.35 GHz h |
| qubit frequency | $\omega_1$ | $2\pi \times 5.0$ GHz |
| ancilla frequency | $\omega_2(0)$ | $2\pi \times 6.0$ GHz |
| qubit-ancilla coupling frequency | $g$ | $2\pi \times 16$ MHz |
| perturbation parameter | $g/[\omega_2(0) - \omega_1]$ | 0.016 |
| qubit max relaxation time | $T_1^{max}$ | 10 $\mu$s |
| qubit min relaxation time | $T_1^{min}$ | 3 ns |

FIG. 5

QUBIT LEAKAGE ERROR REDUCTION

PRIORITY CLAIM

This application claims priority to European Patent Application No. 20184473.5, filed on Jul. 7, 2020, the entire disclosure of which is incorporated by reference herein.

TECHNICAL FIELD

The present disclosure relates to quantum computing, and more particularly to an arrangement for reducing qubit leakage errors in a quantum computing system.

BACKGROUND

In quantum computing, binary information is typically stored in a two-level quantum system. However, many realizations or implementations of such quantum bits have more than two energy levels. In such cases, the qubit is typically assigned to the two lowest energy levels, forming the computational basis. Excitation to higher energy levels of the qubit should be prevented for the system to accurately implement a qubit. A qubit experiences leakage error when any of the higher energy levels become excited, i.e. when their quantum states mix with the lower energy levels used for quantum computing. Leakage errors may occur because of, for example, gate operations applied to the qubit or system-environment interactions. Leakage errors cannot be fixed with standard quantum error corrections, which only address errors within quantum computations.

SUMMARY

This summary is provided to introduce a selection of concepts in a simplified form that are further described below in the detailed description. This summary is not intended to identify key features or essential features of the claimed subject matter, nor is it intended to be used to limit the scope of the claimed subject matter.

It is an objective to provide a system, an arrangement, and/or an apparatus for reducing qubit leakage errors in a quantum computing system. The foregoing and other objectives are achieved by the features of the independent claims. Further implementation forms are apparent from the dependent claims, the description, and the figures.

According to a first aspect, an arrangement or an apparatus for reducing qubit leakage errors includes a first qubit and a second qubit selectively couplable to each other and a first energy dissipation structure selectively couplable to the first qubit. The first energy dissipation structure is configured to dissipate energy transferred to the first energy dissipation structure. The arrangement or apparatus also includes a control unit configured to perform a first quantum operation to transfer at least one property of a quantum state from the first qubit to the second qubit, couple the first qubit to the first energy dissipation structure for a time interval, and perform a second quantum operation to transfer the at least one property of the quantum state from the second qubit to the first qubit after the time interval. The arrangement or apparatus may, for example, reduce leakage errors in the first qubit.

In an implementation form of the first aspect, the arrangement or apparatus further includes a second energy dissipation structure selectively couplable to the second qubit. The second energy dissipation structure is configured to dissipate energy transferred to the second energy dissipation structure. The control unit is further configured to initialize the second qubit to a ground state by coupling the second qubit to the second energy dissipation structure before performing the first quantum operation and/or initialize the second qubit to a ground state by coupling the second qubit to the second energy dissipation structure after performing the second quantum operation. The arrangement or apparatus may, for example, efficiently initialize the second qubit for storing the at least one property from the first qubit.

In a further implementation form of the first aspect, the first energy dissipation structure and/or the second energy dissipation structure includes at least one normal metal-insulator-superconductor (NIS) junction. The arrangement or apparatus may, for example, efficiently transfer energy from the first qubit to the energy dissipation structure, thereby reducing a population of non-computational states of the first qubit.

In a further implementation form of the first aspect, the first energy dissipation structure and/or the second energy dissipation structure includes a quantum circuit refrigerator (QCR). The QCR includes a voltage-biased superconductor-insulator-normal metal-insulator-superconductor (SINIS) junction. The first qubit is electrically coupled to the normal metal of the SINIS junction of the first energy dissipation structure and/or the second qubit is electrically coupled to the normal metal of the SINIS junction of the second energy dissipation structure. The arrangement or apparatus may, for example, efficiently and in a controllable manner transfer energy from the first qubit to the energy dissipation structure, thereby reducing a population of non-computational states of the first qubit.

In a further implementation form of the first aspect, the control unit is configured to couple the first qubit to the first energy dissipation structure for the time interval by tuning a bias voltage of the SINIS junction of the first energy dissipation structure. The arrangement or apparatus may, for example, efficiently control the coupling between the energy dissipation structure and the first qubit.

In a further implementation form of the first aspect, the first energy dissipation structure and/or the second energy dissipation structure is configured to dissipate photon energy transferred to the respective energy dissipation structure via photon-assisted electron tunneling in the NIS/SINIS junction. The arrangement or apparatus may, for example, efficiently dissipate photon energy transferred to the first or second energy dissipation structure.

In a further implementation form of the first aspect, the first qubit and/or the second qubit includes a superconductive qubit.

In a further implementation form of the first aspect, the first qubit and/or the second qubit includes a transmon qubit.

In a further implementation form of the first aspect, the control unit is configured to perform the first quantum operation and/or the second quantum operation by performing a SWAP or iSWAP operation between the first qubit and the second qubit. The arrangement or apparatus may, for example, efficiently transfer the at least one property of the quantum state between the first and the second qubit.

In a further implementation form of the first aspect, the control unit is configured to perform the first quantum operation and/or the second quantum operation by bringing the first qubit and the second qubit into resonance via shifting a resonance frequency of at least one of the first qubit or the second qubit. The arrangement or apparatus may, for example, efficiently control the transfer of the at least one property of the quantum state between the first and the second qubit.

In a further implementation form of the first aspect, the control unit is configured to shift the resonance frequency of the first/second qubit via flux tuning. The arrangement or apparatus may, for example, efficiently shift the resonance frequency of the first/second qubit.

In a further implementation form of the first aspect, the arrangement or apparatus further includes a first plurality qubits including the first qubit and a second plurality of qubits including the second qubit. Each qubit in the second plurality of qubits is selectively couplable to a corresponding qubit in the first plurality of qubits. The arrangement or apparatus additionally comprises a plurality of energy dissipation structures including the first energy dissipation structure. Each energy dissipation structure in the plurality of energy dissipation structures is selectively couplable to a corresponding qubit in the first plurality of qubits. Each energy dissipation structure in the plurality of energy dissipation structures is configured to dissipate energy transferred to that energy dissipation structure. The control unit is further configured to perform the first quantum operation to transfer the at least one property of the quantum state from each qubit in the first plurality of qubits to a corresponding qubit in the second plurality of qubits, couple each qubit in the first plurality of qubits to a corresponding energy dissipation structure in the plurality of energy dissipation structures for a time interval, and perform a second quantum operation to transfer the at least one property of the quantum state from each qubit in the second plurality of qubits to the corresponding qubit in the first plurality of qubits. The arrangement or apparatus may, for example, reduce leakage errors when the quantum state is formed collectively by the first plurality of qubits.

According to a second aspect, a quantum computing system comprises the arrangement or apparatus according to the first aspect.

According to a third aspect, a method for reducing qubit leakage errors includes performing a first quantum operation to transfer at least one property of a quantum state from a first qubit to a second qubit, coupling the first qubit to an energy dissipation structure for a time interval, and performing a second quantum operation to transfer the at least one property of the quantum state from the second qubit to the first qubit after the time interval.

According to a fourth aspect, a computer program product comprises program code configured to perform the method according to the third aspect when the computer program product is executed on a computer.

Many of the attendant features will be more readily appreciated based on the following detailed description provided in connection with the accompanying drawings.

DESCRIPTION OF THE DRAWINGS

In the following, example embodiments are described in more detail with reference to the attached figures and drawings, in which:

FIG. 3 illustrates a schematic representation of an energy dissipation structure, according to an embodiment;

FIG. 4 illustrates a plot representation of single-gate error, according to an embodiment;

FIG. 5 illustrated a table of circuit parameters, according to an embodiment;

In the following, like reference numerals are used to designate like parts in the accompanying drawings.

DETAILED DESCRIPTION

In the following description, reference is made to the accompanying drawings, which form part of the disclosure, and in which are shown, by way of illustration, specific aspects in which the present disclosure may be placed. It is understood that other aspects may be utilized, and structural or logical changes may be made without departing from the scope of the present disclosure. The following detailed description, therefore, is not to be taken in a limiting sense, as the scope of the present disclosure is defined by the appended claims.

For instance, it is understood that a disclosure in connection with a described method may also hold true for a corresponding device or system configured to perform the method and vice versa. For example, if a specific method step is described, a corresponding device may include a unit to perform the described method step, even if such unit is not explicitly described or illustrated in the figures. On the other hand, for example, if a specific apparatus is described based on functional units, a corresponding method may include a step performing the described functionality, even if such step is not explicitly described or illustrated in the figures. Further, it is understood that the features of the various example aspects described herein may be combined with each other, unless specifically noted otherwise.

Figure 1:
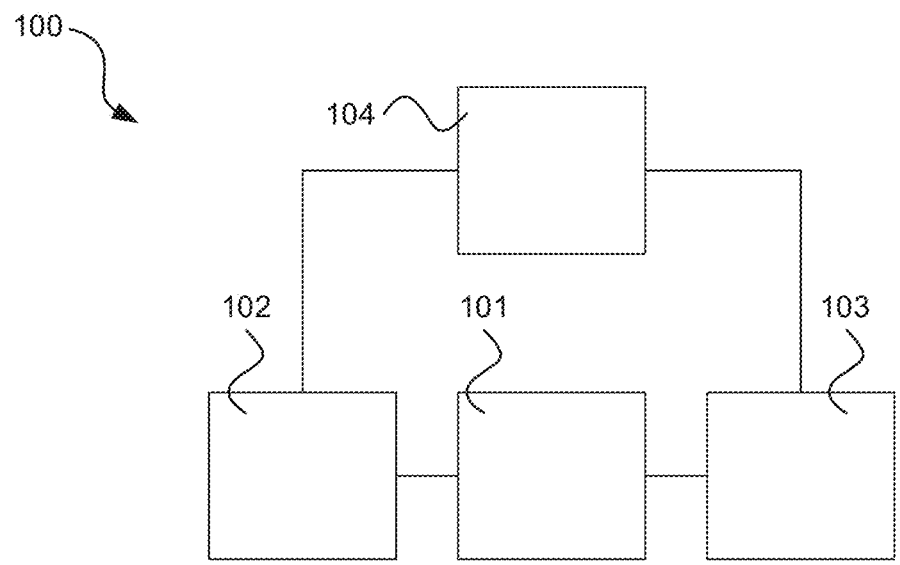
FIG. 1 illustrates a schematic representation of an arrangement for reducing qubit leakage errors, according to an embodiment.

FIG. 1 illustrates a schematic representation of an arrangement 100 (e.g., an apparatus) for reducing qubit leakage errors according to an embodiment. According to the embodiment, the arrangement 100 includes a first qubit 101 and a second qubit 102 selectively couplable to each other. The first qubit 101 and the second qubit 102 may be, for example, electrically coupled to each other. The first qubit 101 may also be referred to as a computational qubit and the second qubit 102 may be referred to as an ancilla qubit.

As provided herein, when two elements are electrically coupled, the elements may have an electrical connection between each other. The electrical connection may comprise any number of electrical components/elements, such as capacitors, inductors, transmission lines, etc.

The first/second qubit 101, 102 may have a ground state $|g\rangle$. As provided herein, the ground state may refer to a quantum state of a qubit with a lowest energy. The first/second qubit 101, 102 may further have a plurality of excited states. The plurality of excited states may comprise a lowest excited state $|e\rangle$. As provided herein, the lowest excited state may refer to a quantum state of the qubit with a second lowest energy.

The ground state and the lowest excited state of a qubit may correspond to a computational basis of the qubit. For example, the ground state $|g\rangle$ may correspond to the

|0⟩ state of the qubit and the lowest excited state |e⟩ may correspond to the |1⟩ state of the qubit or vice versa. Other quantum states of a qubit may be referred to as non-computational states. An energy gap between the ground state and the lowest excited state may correspond to a resonance frequency of the qubit.

The plurality of excited states may further comprise a second lowest excited state |f⟩. The second lowest excited state has a higher energy than the ground state |g⟩ and the lowest excited state |e⟩.

The arrangement 100 of FIG. 1 may further include a first energy dissipation structure 103 selectively couplable to the first qubit 101. The first energy dissipation structure 103 may be configured to dissipate energy transferred to the first energy dissipation structure 103. The first energy dissipation structure 103 may also be referred to as an environment, an engineered environment, a bath, a dissipation source, or similar.

Although some embodiments and analysis disclosed herein may refer to specific implementations of the first energy dissipation structure 103, it should be appreciated that the first energy dissipation structure 103 may be implemented using, for example, any dissipation structure with controllable coupling to the first qubit 101.

The first energy dissipation structure 103 may be electrically coupled to the first qubit 101. The first energy dissipation structure 103 may be selectively couplable to the first qubit 101 by, for example, tuning coupling strength between the first energy dissipation structure 103 and the first qubit 101. It should be appreciated that although the first qubit 101 and the first energy dissipation structure 103 may be electrically coupled continuously, coupling between the first qubit 101 and the first energy dissipation structure 103 may still be selective, if the coupling strength between the first qubit 101 and the first energy dissipation structure 103 can be controlled.

As provided herein, when two objects are selectively couplable, the strength of interaction between the objects may be controlled and/or turned on and off. For example, two objects that are selectively couplable may be tuned into resonance or detuned out of resonance and/or the magnitude of the coupling can be controlled. It should be appreciated that even if there is a continuous connection, such as an electrical/capacitive/inductive connection, between two elements, the elements can still be selectively couplable, if the interaction between the elements can be tuned. For example, the first 101 and second qubit 102 may be capacitively coupled, but the coupling between the qubits can be selective, since interaction between the qubits can be tuned by, for example, shifting the qubits into and out of resonance.

The arrangement 100 may further comprise a control unit 104. The control unit 104 may be configured to perform a first quantum operation to transfer at least one property of a quantum state from the first qubit 101 to the second qubit 102. The control unit 104 may be coupled to the first qubit 101, the second qubit 102, the first energy dissipation structure 103, and/or any other element/component of the arrangement 100. The first quantum operation may include, for example, a first swap operation.

The at least one property of the quantum state may include, for example, any single property of the quantum state, a plurality of properties of the quantum state, or the whole quantum state. The quantum state may include at least one of a local property or a non-local property. For a generic many-body quantum state, i.e. a quantum state encoded in multiple qubits, local properties may refer to those that can be retrieved via local measurements of each individual qubit. These properties include, for example, populations or coherences of the qubit. In turn, non-local properties may refer to properties encoded in two or more qubits, and which can only be retrieved via non-local measurements over the two or more qubits. The non-local properties include, for instance, entanglement.

The control unit 104 may, for example, bring the first qubit 101 and the second qubit 102 into resonance in order to perform the first quantum operation. As provided herein, when the first qubit 101 and the second qubit 102 are in resonance, they may be referred to as coupled. When the first qubit 101 and the second qubit 102 are in resonance/coupled, quantum logical gate operations may be performed on the qubits.

According to an embodiment, the control unit 104 is configured to perform the first quantum operation and/or the second quantum operation by bringing the first qubit 101 and the second qubit 102 into resonance via shifting a resonance frequency of the first/second qubit. According to an embodiment, the control unit 104 is configured to shift the resonance frequency of the first/second qubit via flux tuning. In flux tuning, the control unit 104 can tune the resonance frequency of the first/second qubit 101, 102 by causing a magnetic flux through the first/second qubit 101, 102.

The first quantum operation may include, for example, a SWAP gate operation or an iSWAP gate operation. An iSWAP gate can be transformed into a SWAP gate by single-qubit operations. Thus, the terms SWAP and iSWAP may be used interchangeably herein.

The first qubit 101 and the second qubit 102 may be initially decoupled. The first qubit 101 may be initially in some unknown quantum state and the second qubit 102 may be initially in a ground state. The quantum operation can transfer computational information from the first qubit 101 to the second qubit 102. For an ideal gate operation, the transfer of any non-computational occupation between the qubits during the quantum operation may be negligible.

The control unit 104 may be further configured to couple the first qubit 101 to the energy dissipation structure 103 for a time interval. The control unit 104 may, for example, couple the first qubit 101 and the energy dissipation structure 103 by tuning the coupling strength between the first qubit 101 and the energy dissipation structure 103. The time interval may be long enough to ensure that non-computational states of the first qubit 101 are depleted. After the time interval, the control unit 104 may switch off the coupling between the first qubit 101 and the first energy dissipation structure 103.

The coupling between the first qubit 101 and the first energy dissipation structure 103 may rapidly reduce energy occupation in the non-computational states of the first qubit 101. The coupling may increase energy occupation in the computational states of the first qubit 101. Thus, leakage errors of the first qubit 101 may be reduced.

The control unit 104 may be further configured to perform a second quantum operation to transfer at least one property of the quantum state from the second qubit 102 to the first qubit 101 after the time interval.

The first/second quantum operation may also be referred to as first/second quantum gate, first/second quantum gate operation, or similar. During the first quantum operation, computational information may be transferred from the first qubit 101 to the second qubit 102. Energy occupation of the non-computational states of the first qubit 101 may be reduced during the coupling between the first qubit 101 and the first energy dissipation structure 103. The computational information may then be transferred back to the first qubit 101 from the second qubit 102 via the second quantum operation. The non-computational information is removed from the first qubit 101 during the coupling to the energy dissipation structure 103, but there always exists a non-zero occupation in the lowest excited state after the coupling.

This is a bit-flip error. Further, for an arbitrary initial state, the off-diagonal elements may also be non-zero in the computational basis, comprising phase-flip errors. There are also some unavoidable bit-flip and phase-flip errors that may occur in the SWAP operations. Thus, leakage errors in the first qubit 101 can be converted to bit-flip and phase errors. Bit-flip and phase errors may be corrected using, for example, quantum error correcting codes.

According to an embodiment, the first qubit 101 and/or the second qubit 102 includes a superconductive qubit. According to another embodiment, the first qubit 101 and/or the second qubit 102 includes a transmon qubit. Alternatively, the first/second qubit 101, 102 may include any other type of qubit, such as a superconductive quantum interference device (SQUID) qubit, a flux qubit, a charge qubit, or a phase qubit.

Although some embodiments may be disclosed herein with reference to a certain type of qubit, these qubit types are only exemplarily. In any embodiment disclosed herein, the first/second qubit may be implemented in various ways and using various technologies.

The arrangement 100 of FIG. 1 may be embodied in, for example, a quantum computing system. Such a quantum computing system may include a plurality of qubits for performing quantum computation(s). Each such qubit may be implemented using the arrangement 100. The arrangement 100 may be realized, for example, in a superconducting circuit architecture.

When the arrangement 100 is operational, the first qubit 101, the second qubit 102, and the energy dissipation structure 103 may be physically located in a cryostat or similar. The cryostat may cool the qubits 101, 102 and other components of the arrangement 100, such as the energy dissipation structure 103, to cryogenic temperatures. This may be required if the qubits 101, 102 correspond to, for example, superconductive qubits. The control unit 104 may be located outside the cryostat.

According to an embodiment, the control unit 104 is configured to perform the first quantum operation and/or the second quantum operation by bringing the first qubit 101 and the second qubit 102 into resonance via shifting a resonance frequency of the first/second qubit 101, 102.

According to an embodiment, the arrangement 100 further includes a first plurality qubits including the first qubit 101 and a second plurality of qubits including the second qubit 102. Each qubit in the second plurality of qubits may be selectively couplable to a corresponding qubit in the first plurality of qubits. The arrangement 100 may further include a plurality of energy dissipation structures including the first energy dissipation structure 103. Each energy dissipation structure in the plurality of energy dissipation structures is selectively couplable to a corresponding qubit in the first plurality of qubits. Additionally, each energy dissipation structure in the plurality of energy dissipation structures is configured to dissipate energy transferred to that energy dissipation structure.

The control unit 104 may be further configured to perform a first quantum operation to transfer at least one property of a quantum state from each qubit in the first plurality of qubits to a corresponding qubit in the second plurality of qubits, couple each qubit in the first plurality of qubits to a corresponding energy dissipation structure in the plurality of energy dissipation structures for a time interval, and perform a second quantum operation to transfer the at least one property of the quantum state from each qubit in the second plurality of qubits to the corresponding qubit in the first plurality of qubits.

Figure 2:
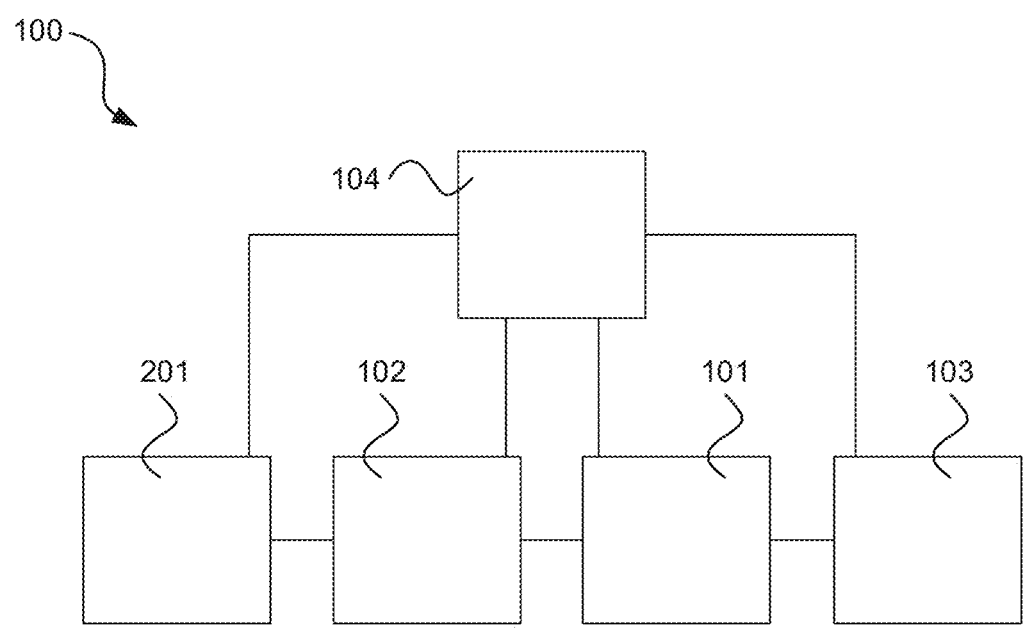
FIG. 2 illustrates a schematic representation of an arrangement for reducing qubit leakage errors, according to another embodiment.

FIG. 2 illustrates a schematic representation an arrangement 100, according to another embodiment. The arrangement 100 may further include a second energy dissipation structure 201 selectively couplable to the second qubit 102. The second energy dissipation structure 201 may be configured to dissipate energy transferred to the second energy dissipation structure 201.

The control unit 104 may be further configured to initialize the second qubit 102 to a ground state by coupling the second qubit 102 to the second energy dissipation structure 201 before the first quantum operation. Alternatively or additionally, the control unit 104 may be further configured to initialize the second qubit 102 to a ground state by coupling the second qubit 102 to the second energy dissipation structure 201 after the second quantum operation.

The control unit 104 may be further configured to couple the second qubit 102 to the second energy dissipation structure 201 for a second time interval. The control unit 104 may, for example, couple the second qubit 102 and the second energy dissipation structure 201 by tuning the coupling strength between the second qubit 102 and the second energy dissipation structure 201. The second time interval may be long enough to ensure that non-computational states and/or states other than the ground state of the second qubit 102 are depleted.

FIG. 3 illustrates a schematic representation of an energy dissipation structure 103, according to an embodiment. The first energy dissipation structure 103 and/or the second energy dissipation structure 201 may be implemented, for example, as shown in the embodiment of FIG. 3.

According to an embodiment, the first energy dissipation structure 103 and/or the second energy dissipation structure 201 comprises at least one normal metal-insulator-superconductor (NIS) junction. For example, in the embodiment of FIG. 3, the energy dissipation structure 103 includes two NIS junctions. These two NIS junctions form a superconductor 303-insulator 302-normal metal 301-insulator 302-superconductor 303 (SINIS) junction. The SINIS junction may be biased by a bias voltage $V_B$.

A metallic island of the normal metal 301 may be charged and discharged by controlling the bias voltage $V_B$ due to electron tunneling across the insulating barriers 302. These tunneling transitions may also involve absorption or emission of photons. The SINIS junction may be referred to as a quantum circuit refrigerator (QCR).

The first qubit 101 may be electrically coupled to the normal metal 301 of the NIS/SINIS junction of the first energy dissipation structure 103. Thus, the first energy dissipation structure 103 may absorb photon energy from the first qubit 101. The second qubit 102 may be electrically coupled to the normal metal 301 of the NIS/SINIS junction of the second energy dissipation structure 201. Thus, the second energy dissipation structure 201 may absorb photon energy from the second qubit 102.

According to an embodiment, the first energy dissipation structure 103 and/or the second energy dissipation structure 201 comprises a quantum circuit refrigerator (QCR). The QCR includes a voltage-biased SINIS junction. The first qubit 101 may be electrically coupled to the normal metal of the SINIS junction of the first energy dissipation structure 103 and/or the second qubit 102 may be electrically coupled to the normal metal of the SINIS junction of the second energy dissipation structure 201.

The control unit 104 may be configured to couple the first qubit 101 to the first energy dissipation structure 103 for the time interval by tuning a bias voltage of the SINIS junction of the first energy dissipation structure 103.

According to an embodiment, the first energy dissipation structure 103 and/or the second energy dissipation structure 201 is configured to dissipate the photon energy transferred to the energy dissipation structure via photon-assisted electron tunneling in the NIS/SINIS junction. The first energy dissipation structure 103 may absorb photons from the first qubit 101 at bias voltages where an electron needs to receive an additional energy quantum from the first qubit 101 to overcome the Bardeen-Cooper-Schrieffer energy gap in the superconductor 303. Thus, the control unit 104 may tune the coupling strength between the first energy dissipation structure 103 and the first qubit 101 via the bias voltage $V_B$.

In the following, the behaviour of an embodiment of the arrangement 100 is discussed. The arrangement 100 can be modelled with the system Hamiltonian, shown below:

$$\hat{H}_S = \hat{H}_1 + \hat{H}_2 + \hat{H}_{int},$$

where $$\hat{H}_i = \hbar\omega_i \hat{b}_i^\dagger \hat{b}_i + \frac{\hbar}{2}\alpha_i \hat{b}_i^\dagger \hat{b}_i^\dagger \hat{b}_i \hat{b}_i$$

$$\hat{H}_{int} = -\hbar g (\hat{b}_1^\dagger - \hat{b}_1)(\hat{b}_2^\dagger - \hat{b}_2),$$

where $\hat{b}_i$ is the annihilation operator for the mode i={1,2}, and $$\hbar\omega_i = \sqrt{8 E_{J_i} E_{C_i}} - E_{C_i}$$

$$\alpha_i = -E_{C_i}$$

$$g = \frac{1}{2}\frac{C_c}{\sqrt{C_1 C_2}}\sqrt{\omega_1 \omega_2},$$

where $E_J$ is the Josephson energy of the Josephson junction of the qubit i, $E_{C_i}$ is the charging energy of the qubit i, $C_c$ is the capacitance between the qubits, and $C_i$ is the capacitance of an individual qubit i. In the equations above, transmon qubits have been modelled as anharmonic Duffing oscillators with frequencies of $\omega_i$. In addition, the anharmonicity parameters have been defined as $\alpha_i = \omega_{12,i} - \omega_{01,i}$ and the coupling frequency defined as g.

In the following, the evolution of occupations in the non-computational states under the iSWAP operation is discussed. Here, the system Hamiltonian $\hat{H}_S$ presented above is considered in the interaction picture, which can be obtained with the unitary rotation:

$$\hat{U}(t) = e^{-i(\hat{H}_1 + \hat{H}_2)t/\hbar}.$$

As a consequence, the system Hamiltonian can be written as:

$$\tilde{H}_S = -\hbar g (\hat{b}_1^\dagger - \hat{b}_1)(\hat{b}_2^\dagger - \hat{b}_2)$$

where the annihilation operators in the interaction picture can be defined as:

$$\tilde{b}_i = \hat{U}^\dagger(t)\hat{b}_i\hat{U}(t) = \sum_n \sqrt{n+1}\, e^{-i(\omega_i + n\alpha_i)t}|n\rangle\langle n+1|,$$

Where, in the last equality, the annihilation operators have been represented in the Fock basis $\{|n\rangle\}$ of the Duffing oscillator with n=0, 1, 2, . . . . Similarly to the typical iSWAP realizations, it is assumed that the qubits are in resonance, i.e. $\omega_1 = \omega_2 = \omega_q$. As a consequence, the resonant transitions are time-independent in the interaction picture. This can enable a high fidelity of the gate. If $g \ll \omega_q$, one can make a rotating-wave approximation and neglect the matrix elements of the Hamiltonian $\tilde{H}_S$ for the transitions that do not conserve the occupation number.

In order to quantify the effects on the non-computational states during the iSWAP gate operation, the above approach is considered with a three-state truncation for the transmon qubits. As a consequence, the following system Hamiltonian in the interaction picture is obtained:

$$\tilde{H}_S \approx -\hbar g \begin{pmatrix} 0 & -e^{i\omega_1 t} & 0 \\ e^{i\omega_1 t} & 0 & -\sqrt{2}\,e^{-i(\omega_1+\alpha_1)t} \\ 0 & \sqrt{2}\,e^{i(\omega_1+\alpha_1)t} & 0 \end{pmatrix} \otimes$$

$$\begin{pmatrix} 0 & -e^{i\omega_2 t} & 0 \\ e^{i\omega_2 t} & 0 & -\sqrt{2}\,e^{-i(\omega_2+\alpha_2)t} \\ 0 & \sqrt{2}\,e^{i(\omega_2+\alpha_2)t} & 0 \end{pmatrix}.$$

The non-zero elements are $$\langle g,g|\tilde{H}_S|e,e\rangle = -\hbar g e^{-i(\omega_1+\omega_2)t} \to 0,$$

$$\langle g,e|\tilde{H}_S|e,g\rangle = \hbar g e^{i(\omega_2-\omega_1)t} = \hbar g,$$

$$\langle g,e|\tilde{H}_S|e,f\rangle = -\sqrt{2}\hbar g e^{-i(\omega_1+\omega_2+\alpha_2)t} \to 0,$$

$$\langle g,f|\tilde{H}_S|e,e\rangle = \sqrt{2}\hbar g e^{i(\omega_2-\omega_1+\alpha_2)t} = \sqrt{2}\hbar g e^{i\alpha_2 t},$$

$$\langle e,g|\tilde{H}_S|f,e\rangle = -\sqrt{2}\hbar g e^{-i(\omega_1+\omega_2+\alpha_1)t} \to 0,$$

$$\langle e,e|\tilde{H}_S|f,g\rangle = -\sqrt{2}\hbar g e^{i(\omega_2-\omega_1-\alpha_1)t} = \sqrt{2}\hbar g e^{-i\alpha_1 t},$$

$$\langle e,e|\tilde{H}_S|f,f\rangle = -2\hbar g e^{-i(\omega_1+\omega_2+\alpha_1+\alpha_2)t} \to 0,$$

$$\langle e,f|\tilde{H}_S|f,e\rangle = 2\hbar g e^{i(\omega_2-\omega_1+\beta_2-\alpha_1)t} = 2\hbar g e^{i(\alpha_2-\alpha_1)t},$$

where the terms that are neglected in the rotating-wave approximation are indicated, and the transmon states $|n\rangle$ with n=g,e,f are labelled for clarity. As a consequence, one can write the system Hamiltonian as:

$$\tilde{H}_S \approx \hbar g (\hat{\sigma}_1^+ \hat{\sigma}_2^- + \hat{\sigma}_1^- \hat{\sigma}_1^+) +$$
$$\sqrt{2}\hbar g(\hat{\sigma}_1^- \hat{\Sigma}_2^+ e^{i\alpha_2 t} + \hat{\sigma}_1^+ \hat{\Sigma}_2^- e^{-i\alpha_2 t}) +$$
$$\sqrt{2}\hbar g(\hat{\Sigma}_1^- \hat{\sigma}_2^+ e^{i\alpha_1 t} + \hat{\Sigma}_1^+ \hat{\sigma}_2^- e^{-i\alpha_1 t}) +$$
$$\sqrt{2}\hbar g(\hat{\Sigma}_1^- \hat{\Sigma}_2^+ e^{i(\alpha_2-\alpha_1)t} + \hat{\Sigma}_1^+ \hat{\Sigma}_2^- e^{-i(\alpha_2-\alpha_1)t}),$$

where the annihilation operators have been defined as $\hat{\sigma}_i^- = |g\rangle_i\langle e|_i$ and $\hat{\Sigma}_i^- = |e\rangle_i\langle f|_i$.

Typically, the iSWAP operation can be realised by evolving the above system when the first qubit 101 and the second qubit 102 are in resonance ($\omega_1 = \omega_2$) for the duration $\tau = \pi/(2g)$. In the two-state truncation for the transmons, only the first term of the interaction picture Hamiltonian $\hat{\tilde{H}}_S$ is considered, and the time-evolution operator for such a process can be written in the interaction picture as:

$$\hat{U}_{iSWAP} = \exp\left(-i\hat{\tilde{H}}_S^{ts}\tau/\hbar\right) = -\begin{pmatrix} 1 & 0 & 0 & 0 \\ 0 & \cos(g\tau) & -i\sin(g\tau) & 0 \\ 0 & -i\sin(g\tau) & \cos(g\tau) & 0 \\ 0 & 0 & 0 & 1 \end{pmatrix} = \begin{pmatrix} 1 & 0 & 0 & 0 \\ 0 & 0 & -i & 0 \\ 0 & -i & 0 & 0 \\ 0 & 0 & 0 & 1 \end{pmatrix},$$

where $$\hat{\tilde{H}}_S^{ts} \approx \hbar g\left(\hat{b}_1^\dagger \hat{b}_2 + \hat{b}_1 \hat{b}_2^\dagger\right).$$

To calculate the error produced by the transfer to non-computational states during the iSWAP gate operation, the full interaction picture Hamiltonian $\hat{\tilde{H}}_S$ is considered. It is assumed that the ancilla qubit is initially in the ground state while the computation qubit is in the second excited state, $\hat{\rho}(0)=|f,g\rangle\langle f,g|$, to analyse the non-computational information leakage from the computational qubit to the ancilla. For short time intervals, the third term of the system Hamiltonian in the above-equation dominates the time-evolution and drives the system from $|f,g\rangle$ to $|e,e\rangle$. Neglecting the other terms, an effective system Hamiltonian can be obtained, which in the Schrödinger picture is written as:

$$\hat{H}_S \triangleq \frac{\hbar}{2}\begin{pmatrix} \alpha_1 & \sqrt{8}\,g \\ \sqrt{8}\,g & -\alpha_1 \end{pmatrix}.$$

The dynamics of the occupation $P_f(t)$ in the $|f\rangle$ state of the computational qubit can be solved from the von Neumann equation, and the result can be written as:

$$P_f(t) = 1 - \frac{4g^2}{8g^2 + \alpha_1^2}\left[1 - \cos\left(\sqrt{\alpha_1^2 + 8g^2}\,t\right)\right] =$$

$$1 - \frac{1}{2}\frac{1}{1+\left[\frac{\alpha_1}{\sqrt{8}\,g}\right]^2}\left[1-\cos\left(\sqrt{1+\left[\frac{\alpha_1}{\sqrt{8}\,g}\right]^2}\,\sqrt{8}\,gt\right)\right].$$

In the following, the worst-case estimate for the transferred non-computational information of an iSWAP gate is denoted with $\sqrt{\epsilon_g}=1/\{1+[\alpha_1/(\sqrt{8}g)]^2\}$. This may be referred to as the gate error. Since this is obtained when the cosine term in $P_f(t)$ is equal to −1 and might not coincide with the cosine value for the gate time $\tau$, the above quantity overestimates the single-gate error. On the other hand, the arrangement 100 may perform two iSWAP gates and, thus, the total leakage error transferred from the computational qubit to the ancilla and back during these gate operations is given by $\epsilon_9$.

FIG. 4 illustrates a plot representation of single-gate error $\sqrt{\epsilon_g}$ 401, according to an embodiment. The rectangle 402 indicates a regime for which the single-gate error 401 is $\sqrt{\epsilon_g}>0.1$. In particular, $\sqrt{\epsilon_g}<0.1$, and thus $\epsilon_g<0.01$, for $|\alpha_1|/(\sqrt{8}gs)>3$.

FIG. 5 illustrates a table of circuit parameters, according to an embodiment. In the numerical simulations presented in the following section, the circuit parameters given in the table of FIG. 5 are used. For these parameters, $|\alpha_1|/(\sqrt{8}g)=5.5$, which gives the one-gate error of $\sqrt{\epsilon_g}\approx 0.03$ and, thus, the two-gate error of $\epsilon_9\approx 0.001$.

In the rotating-wave approximation and starting from the ground state of the ancilla, the dynamics of the non-computational information is restricted to the Hilbert space spanned by the states $\{|f,g\rangle, |e,e\rangle, |g,f\rangle\}$. Consequently, the transfer of occupation from $|f,g\rangle \rightarrow |g,f\rangle$ can be suppressed by choosing $\alpha_2 \gg \alpha_1$, which may guarantee incommensurate Rabi frequencies between $|f,g\rangle \rightarrow |e,e\rangle$ and $|e,e\rangle \rightarrow |g,f\rangle$.

Another possible source of error is generated when the first qubit 101 is coupled to the first energy dissipation structure 103. Ideally, the energy dissipation structure 103 couples only to the computational qubit and is decoupled from the ancilla qubit, thus leaving the stored quantum information protected during the depletion of the non-computational information from the computational qubit 101. However, due to the coupling g between the computational qubit 101 and the ancilla qubit 102, the QCR is also indirectly coupled to the ancilla qubit 102. Here, the unwanted effective decay rate of the ancilla qubit 102 and its dependence on the circuit parameters is calculated.

The interaction between the two-qubit system and the QCR can be modelled with the Caldeira-Leggett model, in which the energy dissipation structure 103 is described by an infinite set of harmonic oscillators, which are coupled bilinearly and capacitively to the computational qubit 101. The physics is captured by the Hamiltonian, expressed as:

$$\hat{H} = \hat{H}_S + \hat{H}_B + \hat{H}_I,$$

where $$\hat{H}_B = \hbar\sum_k \omega_k \hat{a}_k^\dagger \hat{a}_k,$$

$$\hat{H}_I = i\hbar(\hat{b}_1^\dagger - \hat{b}_1)\sum_k g_k(\hat{a}_k^\dagger + \hat{a}_k),$$

and $\hat{H}_S$ is the system Hamiltonian disclosed above. If $g=0$, the energy dissipation structure 103 couples only to the computational qubit 101. Using methods such as Born-Markov approximation, tracing over the energy dissipation structure 103, and secular approximation, one can derive a Lindblad master equation for the computational qubit 101. This equation contains a dissipative term that describes the dissipation and the decoherence of the qubits, and a coherent term, that describes the correction to the energies of the qubits produced by the environment. Consequently, the interaction between the computational qubit 101 and the energy dissipation structure 103 is described by the dissipation rate $\kappa$ and the temperature of the energy dissipation structure 103.

When the computational qubit 101 and the ancilla qubit 102 are coupled, $g>0$, there can be an error arising from unwanted decay of the ancilla qubit 102. To analyse this, two limiting regimes are considered. In the case of $g \gg \kappa$, the dissipation rate $\gamma$ of the ancilla qubit 102 can be analytically calculated. Here, the results for the resonant ($\delta=0$) and dispersive ($\delta \gg g$) limits are summarized as ($\delta = |\omega_1 - \omega_2|$)

$$\gamma = \begin{cases} \dfrac{\kappa}{2}, & \delta = 0 \\ \dfrac{\kappa g^2}{\delta^2}, & g \ll \delta \end{cases}.$$

In the opposite case of $g \ll \kappa$, to obtain analytical results, the computational qubit 101 needs to be treated as a part of a bath seen by the ancilla qubit 102. Consequently, the computational qubit 101 acts as a filter between the ancilla qubit 102 and the energy dissipation structure 103. Approximating the computational qubit 101 as a linear resonator, one can derive the ancilla decay rate for the resonant and dispersive limits, $$\gamma = g^2 \frac{\kappa}{\delta^2 + \kappa^2/4} = \begin{cases} 4g\dfrac{g}{\kappa}, & \delta = 0 \\ \dfrac{\kappa g^2}{\delta^2}, & \kappa \ll \delta \end{cases}.$$

In the above results, it is assumed that T=0. It is noted that, in both cases shown above, the decay rate of the ancilla qubit 102 in the dispersive limit ($\kappa, g \ll \delta$) is given by $\gamma = \kappa g^2/\delta^2$.

Here, it is assumed that during the depletion of the non-computational states of the first qubit 101, when the QCR pulse is on and the first qubit is coupled to the energy dissipation structure 103, and thus dissipates with a rate $\kappa = \kappa_{on}$, $g \lesssim \kappa_{on} \ll \delta = \omega_2(0) - \omega_1$. It is therefore adequate to use a simplified version of the Lindblad master equation, the local Lindblad master equation, which assumes that the bath couples only to the computational qubit 101, and that the coupling with the ancilla qubit 102 is taken into account only in the coherent part of the master equation. As a consequence, the error arising from unwanted decay of the ancilla qubit can be approximated as:

$$\epsilon_\kappa \approx \gamma \tau_\kappa = \frac{g^2}{\delta^2} \kappa_{on} \tau_\kappa \approx 0.0025,$$

where the duration of the QCR pulse has been denoted with $\tau_\kappa = 10/\kappa_{on} = 30$ ns, and the parameter values from FIG. 5 have been used. These results have been confirmed numerically using the local Lindblad master equation for the initial state $\hat{\rho}(0) = |g,e\rangle\langle g,e|$. Even though the parameters obey $\kappa_{on} > g$, which could result in strong-coupling dissipative effects in the resonant case, such contributions may be negligible because $\kappa_{on} \ll \delta$.

Figure 6:
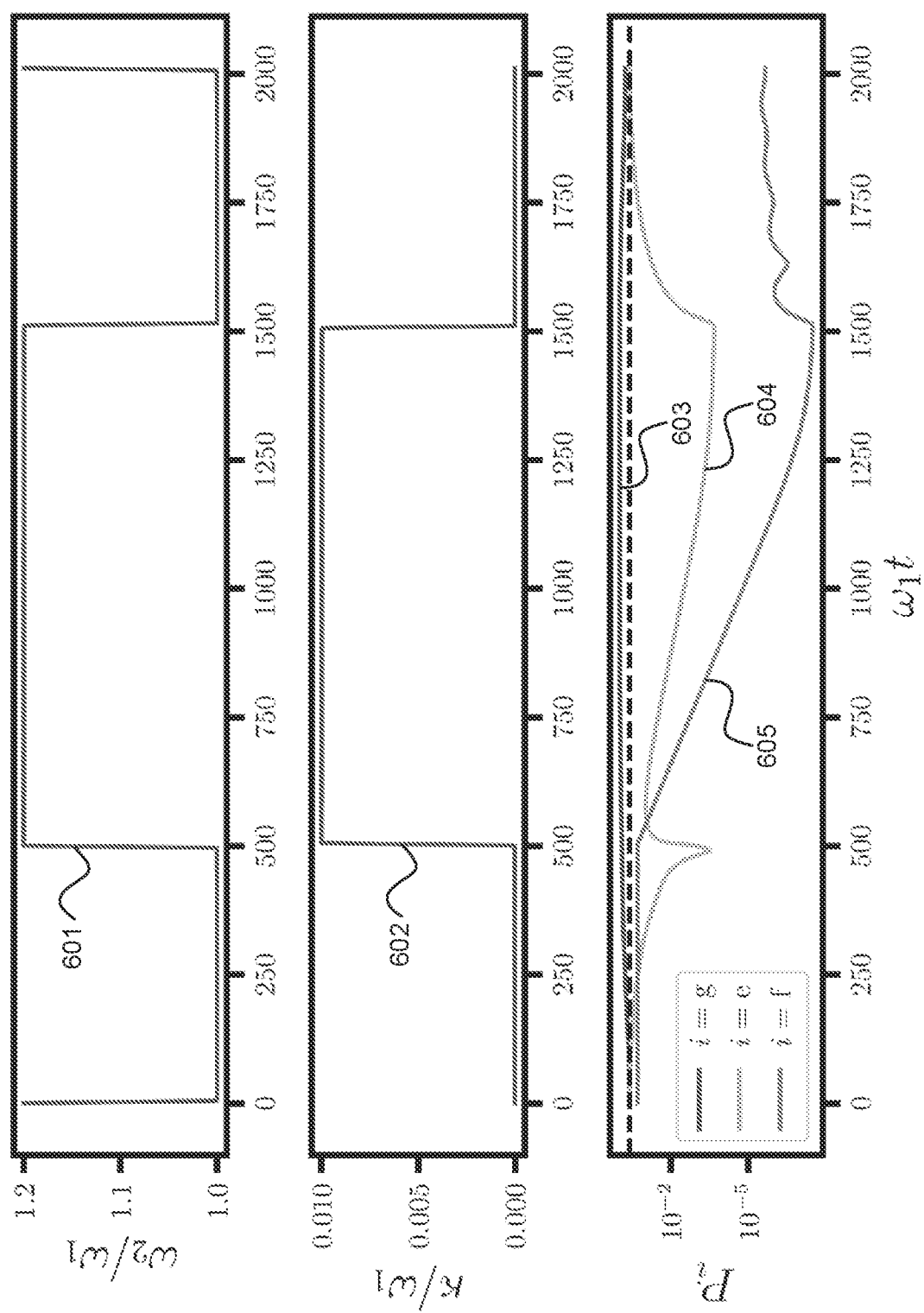
FIG. 6 illustrates a plot representation of tuning between a first and a second qubit, tuning between the first qubit and a first energy dissipation structure, and corresponding state occupations, according to an embodiment.

FIG. 6 illustrates a plot representation of tuning between the first and second qubit, tuning between the first qubit and the first energy dissipation structure, and state occupations, according to an embodiment. In the embodiment of FIG. 6, it is assumed that both transmon qubits comprise three states and the parameters from FIG. 5 are used. The protocol duration is $T = 2000/(2\pi \times 5 \text{ GHz}) \approx 64$ ns.

It is assumed that resonance frequency $\omega_2(t)$ of the ancilla qubit 102 can be tuned via, for example, flux-tuning of the Josephson energy $E_{J_2}$. In addition, it is assumed that the first qubit 101 can be coupled to the QCR, which enables tuning of the dissipation rate $\kappa(t)$ by several orders of magnitude. It is also considered that the tuning of $\omega_2(t)$ changes also the coupling frequency g. In the beginning of the protocol, both qubits are detuned, i.e. $g \ll \delta(0) = \omega_2(0) - \omega_1$.

In the simulation of FIG. 6, the initial state is assumed to be a product state $\hat{\rho}(0) = \hat{\rho}_1(0) \otimes \hat{\rho}_2(0)$, in which the first qubit 101 is in the state:

$$\hat{\rho}_1(0) = \begin{pmatrix} 0.4 & 0.5 + i0.5 & 0 \\ 0.5 - i0.5 & 0.5 & 0 \\ 0 & 0 & 0.2 \end{pmatrix}$$

and the second qubit 102 is in the ground state given by $\hat{\rho}_2(0) = |g\rangle\langle g|$.

Curve 601 represents the ratio between the resonance frequency of the second qubit $\omega_2$ and the resonance frequency of the first qubit $\omega_1$. During the time interval $\omega_1 t = [0, 500]$, $\omega_2/\omega_1 = 1$, the first qubit 101 and the second qubit 102 are in resonance for the first swap operation. During time interval $\omega_1 t = [500, 1500]$, $\omega_2/\omega_1 = 1.2$, the first qubit and the second qubit are out of resonance. During time interval $\omega_1 t = [1500, 2000]$, again $\omega_2/\omega_1 = 1$, the first qubit 101 and the second qubit 102 are in resonance for the second gate operation.

Curve 602 represents the ratio $\kappa/\omega_1$. Thus, curve 602 corresponds to the coupling between the first qubit 101 and the QCR in units of $\omega_1$. During the time interval $\omega_1 t = [500, 1500]$, $\kappa/\omega_1 = 0.01$, and otherwise $\kappa/\omega_1 = 0$.

Curve 603 represents the occupation of the ground state $|g\rangle$ of the computational qubit 101, curve 604 represents the occupation of the lowest excited state $|e\rangle$ of the computational qubit 101, and curve 605 represents the occupation of the second lowest excited state $|f\rangle$ of the computational qubit 101.

In the embodiment of FIG. 6, the dissipation has been modelled using the local Lindblad equation for the computational qubit 101. As a result, the incoherent or dissipative dynamics ignores the ancilla qubit 102, which is valid in the limit of $\kappa > g$, i.e. if the computational qubit 101 can be treated as a part of the bath seen by the ancilla. For the parameters of FIG. 5, the coupling angular frequency is $g = 2\pi \times 0.016$ GHz and the value of the dissipation rate in the on-state of the QCR is $$\kappa_{on} = 3.1 \times 10^8 \frac{1}{s},$$

resulting in $$\frac{\kappa_{on}}{g} = 3.1 > 1.$$

As can be observed from the results disclosed herein, at least with the used parameter values and the initial states, the protocol performed by the arrangement 100 results in lowered occupation in the second excited state of the computational qubit 101. The used value for the energy dissipation structure 103 induced decay rate ($T_1^{min} = 3$ ns) may be too high. With the exemplary parameters, the duration of the protocol is $T = 64$ ns, which leaves room for parameter optimization. The protocol speed can be increased by increasing the coupling g and the value of the dissipation rate $\kappa$ in the coupling between the first qubit 101 and the energy dissipation structure 103. However, large g may require large $\delta(0)=\omega_2(0)-\omega_1$, the maximum value of which may be bounded by the circuit parameters and other experimental restrictions.

Figure 7:
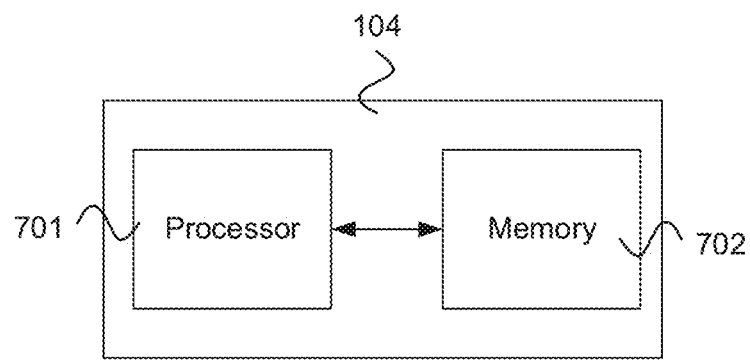
FIG. 7 illustrates a schematic representation of a control unit, according to an embodiment.

FIG. 7 illustrates a schematic representation of a control unit 104, according to an embodiment. The control unit 104 may include at least one processor 701. The at least one processor 701 may comprise, for example, one or more of various processing devices, such as a co-processor, a microprocessor, the control unit 104, a digital signal processor (DSP), a processing circuitry with or without an accompanying DSP, or various other processing devices including integrated circuits such as, for example, an application specific integrated circuit (ASIC), a field programmable gate array (FPGA), a microprocessor unit (MCU), a hardware accelerator, a special-purpose computer chip, or the like.

The control unit 104 may further include a memory 702. The memory 702 may be configured to store, for example, computer programs and the like. The memory 702 may comprise one or more volatile memory devices, one or more non-volatile memory devices, and/or a combination of one or more volatile memory devices and non-volatile memory devices. For example, the memory 702 may be embodied as magnetic storage devices (such as hard disk drives, floppy disks, magnetic tapes, etc.), optical magnetic storage devices, and semiconductor memories (such as mask ROM, PROM (programmable ROM), EPROM (erasable PROM), flash ROM, RAM (random access memory), etc.).

The control unit 104 may further comprise other components not illustrated in the embodiment of FIG. 7. The control unit 104 may comprise, for example, an input/output bus for connecting the control unit 104 to the arrangement 100. Further, a user may control the control unit 104 via the input/output bus. The user may, for example, control quantum computation operations performed by the arrangement 100 via the control unit 104 and the input/output bus.

When the control unit 104 is configured to implement some functionality, some component and/or components of the control unit 104, such as the at least one processor 702 and/or the memory 702, may be configured to implement this functionality. Furthermore, when the at least one processor 701 is configured to implement some functionality, this functionality may be implemented using program code comprised, for example, in the memory. The control unit 104 may be implemented using, for example, a computer, some other computing device, or similar.

Figure 8:
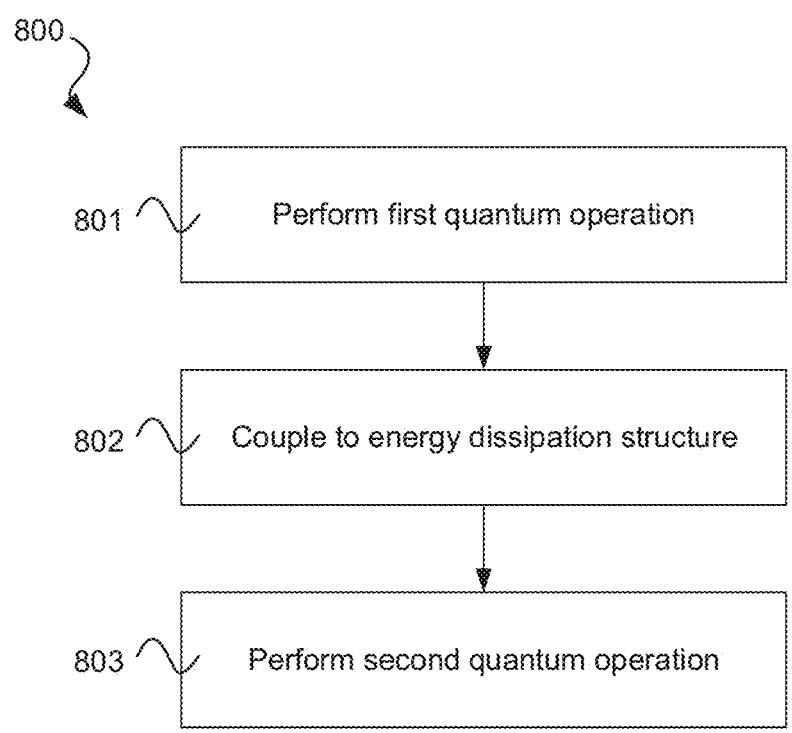
FIG. 8 illustrates a flow chart representation of a method for reducing qubit leakage errors, according to an embodiment.

FIG. 8 illustrates a flow chart representation of a method 800 for reducing qubit leakage errors, according to an embodiment. The method 800 may be performed by, for example, the arrangement 100 and/or the control unit 104 discussed above in connection with FIGS. 1 to 7.

According to the embodiment, the method 800 includes performing a first quantum operation to transfer at least one property of a quantum state from a first qubit to a second qubit (block 801). The method 800 may further include coupling the first qubit to an energy dissipation structure for a time interval (block 802). The method 800 may further include performing a second quantum operation to transfer the at least one property of the quantum state from the second qubit to the first qubit after the time interval (block 803).

Any range or device value given herein may be extended or altered without losing the effect sought. Also any embodiment may be combined with another embodiment unless explicitly disallowed.

Although the subject matter has been described in language specific to structural features and/or acts, it is to be understood that the subject matter defined in the appended claims is not necessarily limited to the specific features or acts described above. Rather, the specific features and acts described above are disclosed as examples of implementing the claims and other equivalent features and acts are intended to be within the scope of the claims.

It will be understood that the benefits and advantages described above may relate to one embodiment or may relate to several embodiments. The embodiments are not limited to those that solve any or all of the stated problems or those that have any or all of the stated benefits and advantages. It will further be understood that reference to 'an' item may refer to one or more of those items.

The steps of the methods described herein may be carried out in any suitable order, or simultaneously where appropriate. Additionally, individual blocks may be deleted from any of the methods without departing from the spirit and scope of the subject matter described herein. Aspects of any of the embodiments described above may be combined with aspects of any of the other embodiments described to form further embodiments without losing the effect sought.

The term 'comprising' is used herein to mean including the method, blocks or elements identified, but that such blocks or elements do not comprise an exclusive list and a method or apparatus may contain additional blocks or elements.

It will be understood that the above description is given by way of example only and that various modifications may be made by those skilled in the art. The above specification, examples and data provide a complete description of the structure and use of exemplary embodiments. Although various embodiments have been described above with a certain degree of particularity, or with reference to one or more individual embodiments, those skilled in the art could make numerous alterations to the disclosed embodiments without departing from the spirit or scope of this specification.

The invention claimed is:

1. An apparatus for reducing qubit leakage errors comprising:
   a first qubit and a second qubit selectively couplable to each other;
   a first energy dissipation structure selectively couplable to the first qubit and configured to dissipate energy transferred to the first energy dissipation structure; and
   a control unit configured to:
      perform a first quantum operation to transfer at least one property of a quantum state from the first qubit to the second qubit,
      couple the first qubit to the first energy dissipation structure for a time interval, and
      perform a second quantum operation to transfer the at least one property of the quantum state from the second qubit to the first qubit after the time interval.

2. The apparatus according to claim 1, further comprising a second energy dissipation structure selectively couplable to the second qubit and configured to dissipate energy transferred to the second energy dissipation structure.

3. The apparatus according to claim 2, wherein the control unit is further configured to initialize the second qubit to a ground state by coupling the second qubit to the second energy dissipation structure before performing the first quantum operation.

4. The apparatus according to claim 2, wherein the control unit is further configured to initialize the second qubit to a ground state by coupling the second qubit to the second energy dissipation structure after performing the second quantum operation.

5. The apparatus according to claim 2, wherein at least one of the first energy dissipation structure or the second energy dissipation structure includes at least one normal metal—insulator—superconductor (NIS) junction.

6. The apparatus according to claim 1, wherein at least one of the first energy dissipation structure or the second energy dissipation structure includes a quantum circuit refrigerator (QCR), wherein the QCR includes a voltage-biased superconductor—insulator—normal metal—insulator—superconductor (SINIS) junction.

7. The apparatus according to claim 6, wherein the first qubit is electrically coupled to the normal metal of the SINIS junction of the first energy dissipation structure.

8. The apparatus according to claim 6, wherein the second qubit is electrically coupled to the normal metal of the SINIS junction of the second energy dissipation structure.

9. The apparatus according to claim 6, wherein the control unit is configured to couple the first qubit to the first energy dissipation structure for the time interval by tuning a bias voltage of the SINIS junction of the first energy dissipation structure.

10. The apparatus according to claim 6, wherein at least one of the first energy dissipation structure or the second energy dissipation structure is configured to dissipate photon energy transferred to the respective energy dissipation structure via photon-assisted electron tunnelling in the SINIS junction.

11. The apparatus according to claim 1, wherein at least one of the first qubit or the second qubit includes a superconductive qubit.

12. The apparatus according to claim 1, wherein at least one of the first qubit or the second qubit includes a transmon qubit.

13. The apparatus according to claim 1, wherein the control unit is configured to perform at least one of the first quantum operation or the second quantum operation by performing a SWAP or iSWAP operation between the first qubit and the second qubit.

14. The apparatus according to claim 1, wherein the control unit is configured to perform at least one of the first quantum operation or the second quantum operation by bringing the first qubit and the second qubit into resonance via shifting a resonance frequency of at least one of the first qubit or second qubit.

15. The apparatus according to claim 14, wherein the control unit is configured to shift the resonance frequency of the at least one of the first qubit or second qubit via flux tuning.

16. The apparatus according to claim 1, further comprising:
a first plurality qubits including the first qubit;
a second plurality of qubits including the second qubit, wherein each qubit in the second plurality of qubits is selectively couplable to a corresponding qubit in the first plurality of qubits; and
a plurality of energy dissipation structures including the first energy dissipation structure, wherein each energy dissipation structure in the plurality of energy dissipation structures is selectively couplable to a corresponding qubit in the first plurality of qubits, and wherein each energy dissipation structure in the plurality of energy dissipation structures is configured to dissipate energy transferred to that energy dissipation structure.

17. The apparatus according to claim 16, wherein the control unit is further configured to:
perform the first quantum operation to transfer the at least one property of the quantum state from each qubit in the first plurality of qubits to a corresponding qubit in the second plurality of qubits;
couple each qubit in the first plurality of qubits to a corresponding energy dissipation structure in the plurality of energy dissipation structures for the time interval; and
perform the second quantum operation to transfer the at least one property of the quantum state from each qubit in the second plurality of qubits to the corresponding qubit in the first plurality of qubits.

18. A quantum computing system comprising the apparatus according to claim 1.

19. A method for reducing qubit leakage errors comprising:
performing a first quantum operation to transfer at least one property of a quantum state from a first qubit to a second qubit;
coupling the first qubit to an energy dissipation structure for a time interval; and
performing a second quantum operation to transfer the at least one property of the quantum state from the second qubit to the first qubit after the time interval.

20. A computer program product comprising program code configured to perform the method according to claim 19 when the computer program product is executed on a computer.

* * * * *